(12) United States Patent
Lesher et al.

(10) Patent No.: US 6,400,208 B1
(45) Date of Patent: Jun. 4, 2002

(54) ON-CHIP TRIM LINK SENSING AND LATCHING CIRCUIT FOR FUSE LINKS

(75) Inventors: Mark K Lesher, Mohrsville; Douglas D Lopata, Boyertown, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/634,790

(22) Filed: Aug. 9, 2000

(51) Int. Cl.$^7$ ............................................. H01H 37/76
(52) U.S. Cl. ...................................................... 327/525
(58) Field of Search ............................. 327/77, 80, 525

(56) References Cited

U.S. PATENT DOCUMENTS

| | | | | |
|---|---|---|---|---|
| 5,345,110 A | * | 9/1994 | Renfro et al. ............. | 307/272.3 |
| 5,617,366 A | * | 4/1997 | Yoo ............................ | 365/201 |
| 5,619,469 A | * | 4/1997 | Joo ........................... | 365/225.7 |
| 5,929,691 A | * | 7/1999 | Kim et al. ................... | 327/525 |
| 5,933,376 A | | 8/1999 | Lee ............................. | 365/200 |
| 5,991,220 A | | 11/1999 | Freyman et al. .......... | 365/335.7 |
| 6,028,756 A | | 2/2000 | Freyman et al. ............. | 361/104 |
| 6,125,069 A | * | 9/2000 | Aoki ......................... | 365/225.7 |
| 6,256,239 B1 | * | 7/2001 | Akita et al. ................. | 365/200 |

* cited by examiner

Primary Examiner—Jeffrey Zweizig
(74) Attorney, Agent, or Firm—David L. Smith

(57) ABSTRACT

An integrated circuit includes a pulse generator for generating a pulse of a predetermined duration. A first switch, controlled by the pulse, drives current into a fuse link when the pulse takes on a first logic level. The first switch prevents flow of current into the fuse link when the pulse takes on a second logic level. A latch is coupled to the fuse link to sense a logic level developed during the pulse. The latch may be cleared by the leading edge of the pulse. The logic level developed at the fuse link due to the driven current is latched into the latch by the trailing edge of the pulse and is indicative of whether the fuse link was blown or not blown.

13 Claims, 2 Drawing Sheets

ON-CHIP TRIM LINK SENSING AND LATCHING CIRCUIT FOR FUSE LINKS

TECHNICAL FIELD

This invention relates generally to integrated circuits, and in particular to an on-chip trim link sensing and latching circuit for fuse links.

BACKGROUND OF THE INVENTION

Integrated circuits on which trimming of critical circuit parameters is required often employ fuse links to achieve the trimming. A fuse link is a low impedance material that can be blown like a fuse such as by driving a large current through the fuse link, or left in tact, that is not blown. Known as programming, the blowing or leaving in tact of fuse links typically occurs when the integrated circuit is tested subsequent to manufacture. During the testing, the fuse links are programmed to trim such parameters as current, voltage, or frequency to overcome processing variations and to generate a precise parameter as a reference.

Metal fuse links, which in an unblown state are a low impedance, may be "blown" or "opened" by passing a current large enough to destroy the fuse link, resulting in a high impedance. Thus, a fuse link that is not blown may represent a first logic state and a fuse link that is blown may represent a second, opposite, logic state. Blowing a fuse link causes the fuse link impedance to change from a relatively low impedance typically in the range of ten ohms to five hundred ohms, to a relatively high impedance ideally in the range of megaohms. When fuse links are blown, the resulting impedance can vary over a large range with some blown fuse links exhibiting an impedance as low as three to five kilo-ohms.

Determining whether a fuse link is blown or not has typically been achieved using an analog sense amplifier. Analog sense amplifiers, however, have the shortcoming of a threshold level of sensitivity within the range of impedances that a blown fuse link may have in that they can not sense an impedance less than a threshold, or minimum impedance. As a result, using an analog sense amplifier to determine whether a fuse link is blown or not blown could result in an erroneous indication that a fuse link was not blown, when in fact it was blown. Furthermore, sense amplifiers require biasing to operate properly.

It is desirable to have an improved technique for sensing whether fuse links are blown or not blown that does not have the shortcoming of the threshold level of sensitivity within the range of impedances that a blown fuse link may have.

SUMMARY OF THE INVENTION

In accordance with the invention, an integrated circuit includes a pulse generator for generating a pulse of a predetermined duration. A first switch, controlled by the pulse, drives current into a fuse link when the pulse takes on a first logic level. The first switch prevents flow of current into the fuse link when the pulse takes on a second logic level. A latch is coupled to the fuse link to sense a logic level developed during the pulse. The latch may be cleared by the leading edge of the pulse. The logic level developed at the fuse link due to the driven current is latched into the latch by the trailing edge of the pulse and is indicative of whether the fuse link is blown or not blown.

DETAILED DESCRIPTION

Figure 1:
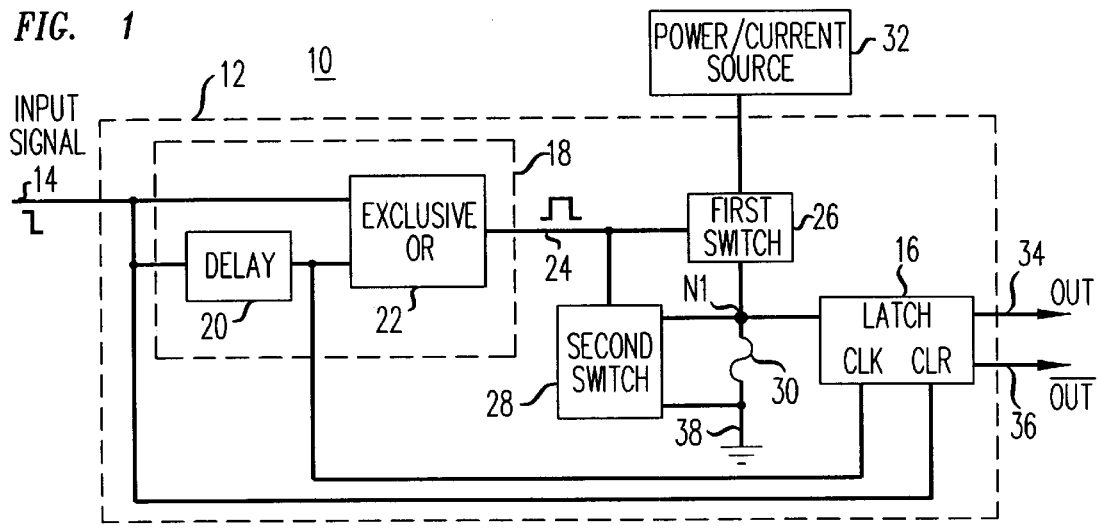
FIG. 1 is a block diagram of a portion of an integrated circuit illustrating an on-chip trim link sensing and latching circuit for fuse links in accordance with the present invention.

A block diagram of portion of an integrated circuit 10 including an on-chip trim link sensing and latching circuit 12 in accordance with an illustrative embodiment of the present invention is shown in FIG. 1. An input signal 14 that transitions from a logic high to a logic low initiates operation of the trim link sensing and latching circuit to determine whether a particular fuse link is blown or not, although the invention is not limited thereto. Input signal 14 clears latch 16, such as by the leading edge, and is provided as an input to monostable multivibrator 18. Monostable multivibrator 18 is comprised of delay 20 and exclusive OR (XOR) gate 22. Monostable multivibrator 18 has one stable state (herein a logic low) in which it can remain indefinitely, and a quasi-stable state (herein a logic high) to which it is triggered by input signal 14. Monostable multivibrator 18, sometimes referred to as a one-shot circuit, remains in the quasi-stable state for a predetermined time period equal to the duration of delay 20. Once the predetermined time period expires, monostable multivibrator 18 returns to its stable state and remains there, awaiting another input signal 14. Monostable multivibrator 18 provides an output 22 that is a pulse, the width of which is determined by the duration of delay 20.

Output 24 drives both first switch 26 and second switch 28. When the time period established by delay 20 expires, latch 16 is clocked at the CLK input to latch-in the state of node N1. Simultaneously monostable multivibrator 18 transitions to its stable state, changing output 24 from a logic high to a logic low.

When output 24 is a logic low, trim link sensing and latching circuit 12 does not sense whether fuse link 30 is blown or not blown. With output 24 in a logic low state, such as during the stable state of monostable multivibrator 18, first switch 26 is opened to isolate fuse link 30 from power/current source 32, and second switch 28 is closed to couple node N1 to a reference potential 38, such as but not limited to ground. Coupling node N1 to reference potential 38 prevents the voltage at node N1 from floating and possibly causing an erroneous indication of whether fuse link 30 is blown.

When output 24 is a logic high, trim link sensing and latching circuit 12 senses whether fuse link 30 is blown or not blown. With output 24 in a logic high state, such as during the quasi-stable state of monostable multivibrator 18, first switch 26 is closed thereby coupling power/current source 32 to fuse link 30, and second switch 28 is opened to isolate node N1 from reference potential 38.

Fuse link 30 is either not blown or blown. If fuse link 30 is not blown, the voltage developed at node N1 will be small due to the low impedance of fuse link 30. The small voltage so developed will not rise to a voltage level sufficient to be recognized as a logic high state. Consequently the voltage developed at node N1 will not set latch 16 to a logic high, and latch output 34 will be a logic low indicating fuse link 30 has not been blown. Latch 16 also may provide a complementary latch output.

If fuse link 30 is blown, the blown fuse link 30 operates as a high impedance. Very little current will flow from power/current source 32, through node N1, to reference potential 38. The voltage developed at node N1 will rise to the voltage level of power/current source 32, less any voltage drop across first switch 26. The voltage developed at node N1 will rise to a voltage level sufficient to be recognized at the input to latch 16 as a logic high state that will set the output of latch 16 to a logic high, indicating fuse link 30 has blown.

In this manner, a monostable multivibrator 18 drives a first switch 26 that can be switched to provide a current to the fuse link 30. Latch 16 senses the voltage developed across the fuse link and detects whether the voltage developed does not exceed a logic level threshold and therefore is a logic low, or whether the voltage exceeds a logic level threshold and therefore is a logic high. The logic state of the voltage developed at node N1 is latched into latch 16, and the sensing circuit is powered down as the monostable multivibrator transitions into its stable state and outputs a logic low at output 24.

Figure 2:
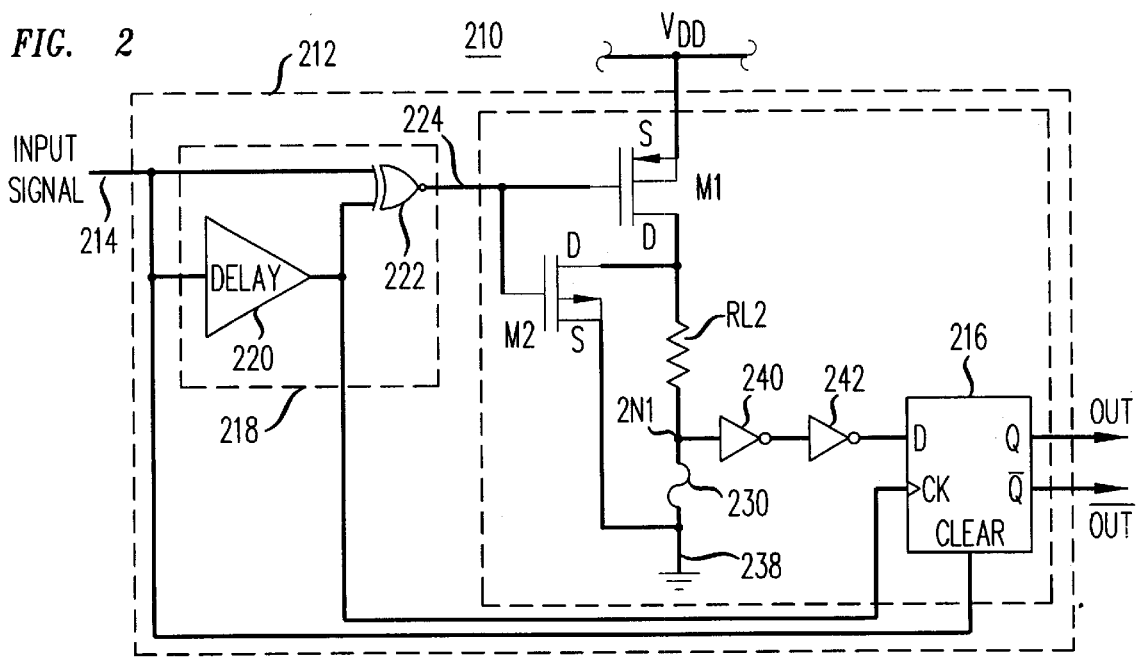
FIG. 2 is a schematic diagram of a portion of an integrated circuit illustrating an on-chip trim link sensing and latching circuit for fuse links in accordance with the present invention.

FIG. 2 is a schematic diagram of an on-chip trim link sensing and latching circuit 212. Similar reference numerals have been used where functions of components are similar. Simplified circuit symbols are used for n-channel and p-channel metal oxide semiconductor field effect transistors.

Monostable multivibrator 218 provides an output 224 that simultaneously drives transistors M1 and M2. Transistor M2 is an n-channel metal oxide semiconductor field effect transistor (MOSFET) that is turned on to couple node 2N1 to reference potential 238, such as ground, when output 224 is a logic low, and is turned off to remove the coupling of node 2N1 to reference potential 238 when output 224 is a logic high. Transistor M1 is a p-channel MOSFET that turns on to couple node 2N1 to the $V_{DD}$ supply when output 224 is a logic high, and turns off to isolate node 2N1 from the $V_{DD}$ supply when output 224 is a logic low.

With transistor M1 turned on, a current passes through the source-drain path of transistor M1 to node 2N1, current limiting resistor RL2 and fuse link 230. The magnitude of the current is dependent on the combined impedances of fuse link 230, current limiting resistor RL2 and the conduction path impedance of transistor M1.

With transistor M1 turned on, fuse link 230 can be sensed as either not blown or blown. When fuse link 230 has not been blown, the voltage developed at node 2N1 is determined by the current flowing through transistor M1, current limiting resistor RL2, and fuse link 230, developing a voltage across the impedance of fuse link 230. Since the impedance of an unblown fuse link is relatively low, the voltage at node 2N1 does not rise to a level sufficient to be detected as a logic high at the D input of latch 216, and the input of inverter 240 if present. The voltage at the D input of latch 216 will thus be in the range of a logic low when latch 216 is clocked at the end of delay 220. Concomitantly, a logic low state will be latched into latch 216 and presented at the Q output.

Inverter 240 has a high input impedance so as not to load node 2N1. While node 2N1 could drive the D input of latch 216 directly, inverters 240 and 242 provide some buffering and driving of latch 216. While a single inverter could provide the buffering and driving function, with two series inverters the logic state input to the D input of latch 216, as well as the logic state of the Q output of latch 216, is the same logic state as the logic state of node 2N1, although the invention is not limited thereto.

When fuse link 230 is blown, the impedance of fuse link 230 is high and the voltage developed at node 2N1 will rise to the voltage of $V_{DD}$, less any voltage drop across transistor M1 and current limiting resistor RL2. Thus, the voltage level at node 2N1 will rise to a level substantially higher than ground and will be sensed by inverter 240 as a logic high, which will cause the output of inverter 240, which is the input to inverter 242, to transition to a logic low. With a logic low at the input of inverter 242, its output, which is coupled to the D input of latch 216, transitions high. With an even number of inverters between node 2N1 and the D input of latch 216, the D input to latch 16 is the same logic state as the logic state sensed at node 2N1, although the invention is not limited thereto. Latch 16 latches the state of its D input and provides that state at its Q output, as well as the complementary state at the complementary output of latch 16.

Once latch 216 latches the state of node 2N1, the output 224 of monostable multivibrator 218 changes state, transistor M1 turns off and transistor M2 turns on to hold node 2N1 at reference potential 238 until the next input signal 214 is applied to trim link and latch circuit 212. The presence of transistor M2 is desirable to hold node 2N1 at a known state, in this case a logic low, so the voltage at node 2N1 does not float and result in an inaccurate detected level.

Current limiting resistor RL2 is present to limit the current when the impedance of fuse link 230 and the conduction path impedance of transistor M1 are small. The current limiting function could be provided by selecting a transistor M1 having a finite conduction path impedance of appropriate magnitude.

The sensing of whether or not the fuse link is blown occurs within the time period established by delay 220. The duration of time delay 220 must be of sufficient duration to assure that a logic state is established at node 2N1. While ten to twenty nanoseconds will suffice, the delay is typically set in the range of one microsecond. Latch 216 holds the state of node 2N1 until the link sensing and latching circuit is turned off, at which time the latch is cleared. One skilled in the art could design a complementary circuit employing voltages of the reverse polarity to those illustrated in FIG. 2.

Figure 3:
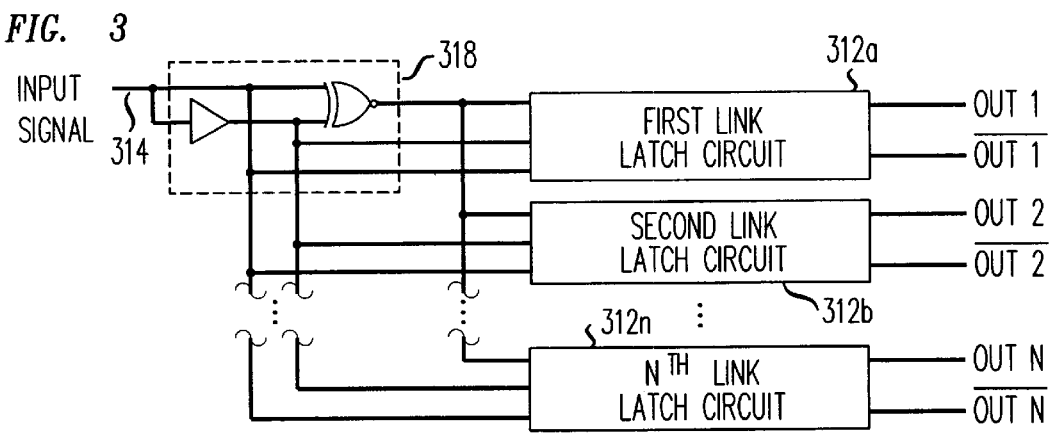
FIG. 3 is a block diagram of a portion of an integrated circuit illustrating more than one on-chip trim link sensing and latching circuit driven by a single monostable multivibrator.

FIG. 3 is a block diagram illustrating that a single monostable multivibrator may be employed to drive more than one trim link sensing and latching circuit, with the output of each trim-link sensing and latching circuit independently available. A single monostable multivibrator 318 driven by a single input signal 314 drives N link sensing and latching circuits 318a, 318b, . . . , 318n.

Figure 4:
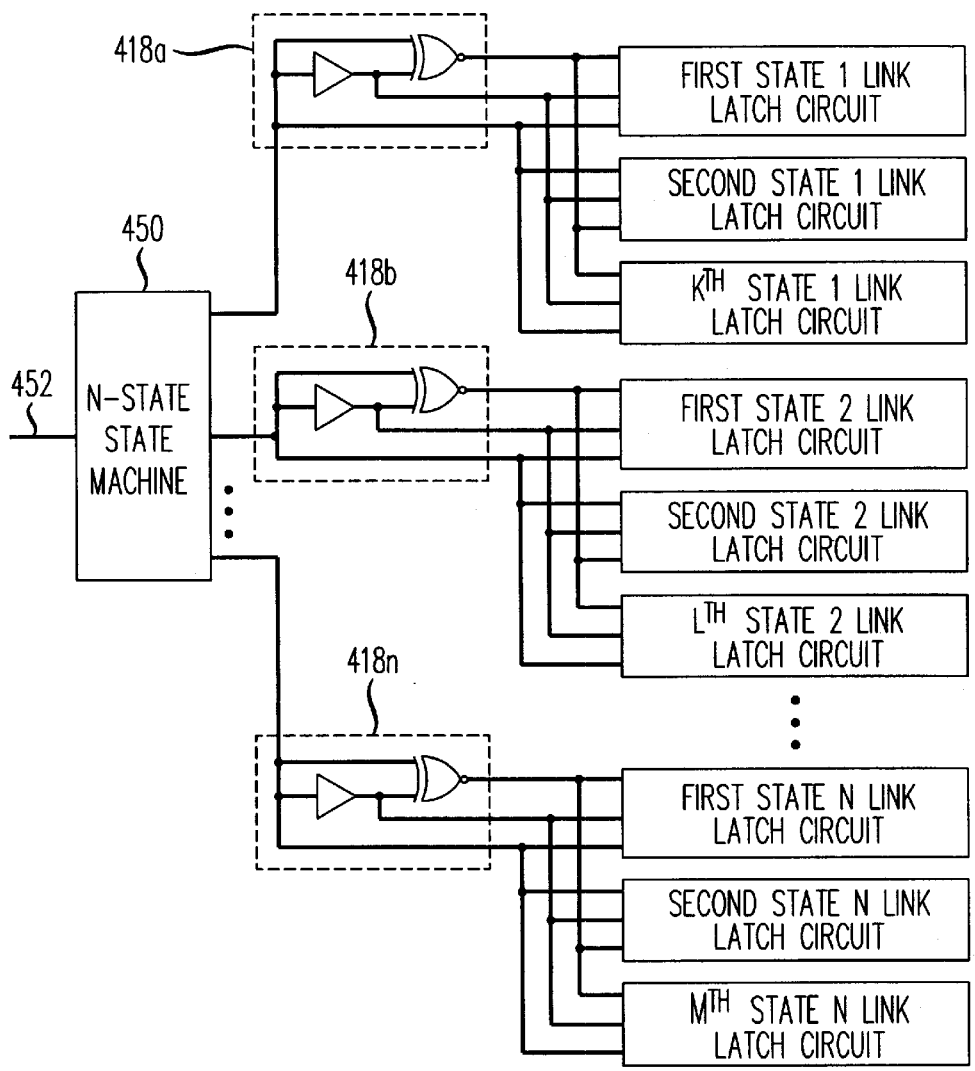
FIG. 4 is a block diagram of a portion of an integrated circuit illustrating multiple monostable multivibrators, each of which drives one or more trim link sensing and latching circuits.

An integrated circuit may have from a few to several hundred trim link sensing and latching circuits. Since turning on multiple trim link sensing and latching circuits simultaneously, each of which draws a current, could cause an undesirably large current, it may be desirable to sequence through a plurality of monostable multivibrators using a state machine as illustrated in FIG. 4. N-state machine 450 receives an initiating signal 452 and sequences through N states. Each of the N states generates an input signal 414a, 414b, . . . , 414n that in turn initiates a respective monostable multivibrator 418a, 418b, . . . , 418n. Each of the N monostable multivibrators activate a plurality of link sensing and latching circuits 412-1-1 through 412-N-M. In this manner, the current drawn for sensing the state of fuse links in an integrated circuit is distributed over the time N-state machine 450 requires to sequence through the plurality of monostable multivibrators. Concomitantly, the current draw is distributed over time and the maximum current drawn is smaller. Furthermore, not all link sensing and latching circuits need to have a pulse of the same duration. Pulses of various durations can be accommodated by the multiple monostable multivibrators.

Figure 5:
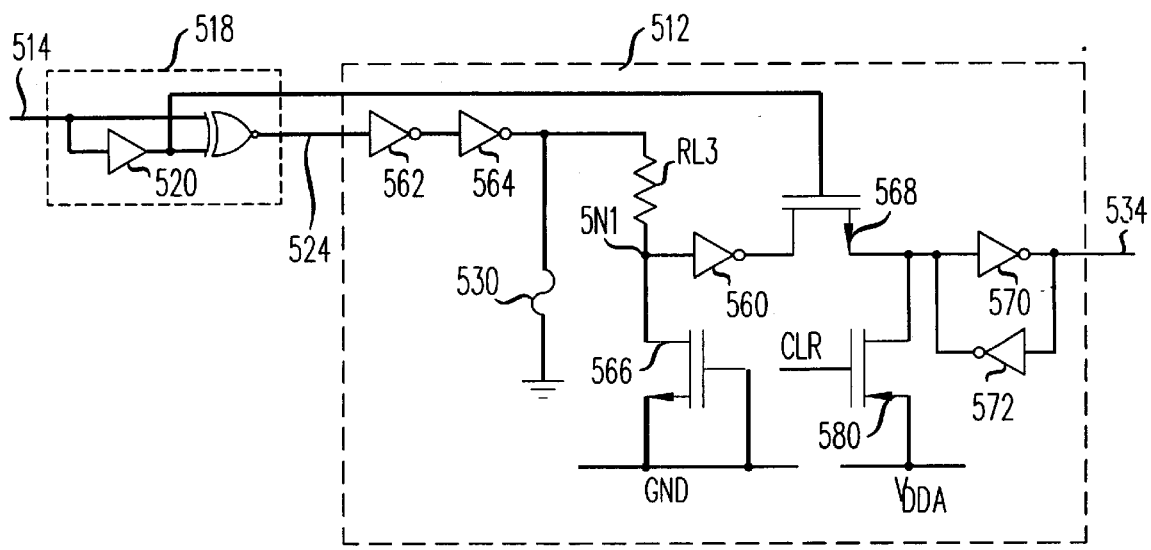
FIG. 5 is a schematic diagram of an alternate embodiment on-chip trim link sensing and latching circuit in which the latch function is achieved by a weak feedback inverter.

FIG. 5 is a schematic diagram of an alternate embodiment on-chip trim link sensing and latching circuit in which the latch function is achieved in a complementary circuit to the circuit illustrated in FIG. 2 by a weak feedback inverter. Monostable multivibrator 518 receives an input signal 514 that transitions from a logic high to a logic low to initiate operation of trim link sensing and latching circuit 512. Monostable multivibrator 518 produces a pulse 524 output to generate an appropriate voltage level above or below the threshold of inverter 560, which is a high impedance inverter so as not to load node 5N1. Inverters 562 and 564 drive fuse link 530 with the same logic state as output from monostable multivibrator 518.

When fuse link 530 is not blown, the output of inverter 564 is pulled low by the low impedance to ground provided by fuse link 530 and the voltage developed at node 5N1 remains below the threshold of inverter 560. Concomitantly, the voltage at node 5N1 is sensed as a logic low state indicating fuse link 530 is not blown.

When fuse link 530 is blown, inverters 562 and 564 drive fuse link 530 with the logic state output from monostable multivibrator 518. Fuse link 530 is a high impedance to ground, and the voltage at node 5N1 rises to substantially the level provided by monostable multivibrator 518, or the output of inverter 516 if present. Thus, the voltage level at node 5N1 exceeds the threshold of inverter 560 and is sensed as a logic high state indicating fuse link 530 is blown.

Resistor RL3 is a current limiting resistor and transistor 566 provides a path to ground for current passing through RL3. Input signal 514 may provide the clear signal for the latch.

When delay 520 times-out and transitions high, the logic state of node 5N1 is latched by the remainder of trim link sensing and latching circuit 512 and is presented at output 534. When the output from delay 520 transitions high, transistor 568 turns on and passes the output from inverter 560 to a latch formed by inverters 570 and 572. Note that the logic level at the output of inverter 560 is the opposite logic level of node 5N1. The latch formed by inverters 570 and 572 is an inverting type latch in that the output is an inverted form of the input. Thus the logic state at output 534 is the same logic state as the logic state of node 5N1. When fuse link 530 is not blown, a logic low is presented at output 534. When fuse link 530 is blown, a logic high is presented at output 534.

While the embodiment of the invention illustrated in FIG. 1 has been described as receiving an input signal that transitions from a logic high to a logic low, the invention is not limited thereto. Transistors other than MOSFET transistors could be employed in the invention.

What is claimed is:

1. An integrated circuit, comprising:
   a pulse generator for generating a pulse of a predetermined duration;
   a fuse link;
   a first switch controlled by the pulse, the first switch driving current into the fuse link when the pulse takes on a first logic level, the first switch preventing the flow of current into the fuse link when the pulse takes on a second logic level;
   a latch coupled to the fuse link to sense a logic level developed during the pulse, the latch cleared by the leading edge of the pulse and the logic level developed at the fuse link latched into the latch by the trailing edge of the pulse, the logic level latched into the latch being indicative of whether the fuse link is blown or not blown.

2. An integrated circuit as recited in claim 1, further comprising a second switch, the second switch controlled by the pulse, the second switch coupling the fuse link to a fixed reference when the pulse takes on the second logic level, the second switch isolating the fuse link from the fixed reference when the pulse takes on the first logic level.

3. An integrated circuit as recited in claim 1, further comprising a current limiting impedance in a current path including the first switch and fuse link, the current limiting impedance limiting the amount of current that can be driven into the fuse link.

4. An integrated circuit as recited in claim 1, wherein the pulse generator is a monostable multivibrator.

5. An integrated circuit as recited in claim 1, wherein the first logic level is a logic high.

6. An integrated circuit as recited in claim 1, wherein the pulse generator is a monostable multivibrator.

7. An integrated circuit, comprising:
   a pulse generator for generating a pulse of predetermined duration; and
   a plurality of trim link sensing and latching circuits triggered by the pulse, each of the trim link and latching circuits comprising
   a fuse link;
   a first switch controlled by the pulse, the first switch driving current into the fuse link when the pulse takes on a first logic level, the first switch preventing the flow of current into the fuse link when the pulse takes on a second logic level; and
   a latch coupled to the fuse link to sense a logic level developed at the fuse link during the pulse, the logic level developed at the fuse link latched into the latch by the pulse, the logic level latched into the latch being indicative of whether the fuse link is blown or not blown.

8. An integrated circuit as recited in claim 7, each of the plurality of trim link and latching circuits further comprising a second switch, the second switch each of the second switches controlled by the pulse, each of the second switches coupling a respective fuse link to a respective reference when the pulse takes on the second logic level, the second switch isolating the respective fuse link from the respective reference when the pulse takes on the first logic level.

9. An integrated circuit, comprising
   a plurality of pulse generators, each of the plurality of pulse generators for generating a respective pulse;
   a state machine having a number of states corresponding to the number of pulse generators in the plurality of pulse generators, the state machine adapted to sequence through the states initiating at least one pulse generator of the plurality of pulse generators in each state, each pulse generator generating a respective pulse; and a plurality of trim link sensing and latching circuits, at least one of the trim link sensing and latching circuits triggered by each pulse generator, each of the trim link and latching circuits comprising a fuse link;

a first switch controlled by the pulse, the first switch driving current into the fuse link when the pulse takes on a first logic level, the first switch preventing the flow of current into the fuse link when the pulse takes on a second logic level; and a latch coupled to the fuse link to sense a logic level developed at the fuse link during the pulse, the logic level developed at the fuse link latched into the latch by the pulse, the logic level latched into the latch being indicative of whether the fuse link is blown or not blown.

10. An integrated circuit as recited in claim 9, where the correspondence between the number of states of the state machine and the number of pulse generators is one to one.

11. A method for determining whether a fuse link is blown or not blown, comprising the steps of:

generating a pulse having a first state and a second state;

driving current into the fuse link during the first state;

detecting a voltage developed across the fuse link during the first state as exceeding the threshold of a logic device and therefore taking on a first logic level or not exceeding the threshold of a logic device and therefore taking on a second logic level;

storing one of the first logic level and the second logic level as representative of the voltage developed across the fuse link; and resetting the logic level representative of the voltage developed across the fuse link as the pulse is being generated.

12. A method as recited in claim 11, wherein the first state is a high state.

13. A method as recited in claim 11, where driving current into the fuse link is achieved by applying the generated pulse to the fuse link.

* * * * *